United States Patent
Cai et al.

(10) Patent No.: US 9,559,009 B2
(45) Date of Patent: Jan. 31, 2017

(54) GATE STRUCTURE CUT AFTER FORMATION OF EPITAXIAL ACTIVE REGIONS

(71) Applicants: International Business Machines Corporation, Armonk, NY (US); GLOBALFOUNDRIES Inc., Grand Cayman (KY)

(72) Inventors: Xiuyu Cai, Niskayuna, NY (US); Kangguo Cheng, Schenectady, NY (US); Johnathan E. Faltermeier, Delanson, NY (US); Ali Khakifirooz, Mountain View, CA (US); Theodorus E. Standaert, Clifton Park, NY (US); Ruilong Xie, Niskayuna, NY (US)

(73) Assignees: International Business Machines Corporation, Armonk, NY (US); GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/876,212

(22) Filed: Oct. 6, 2015

(65) Prior Publication Data

US 2016/0027700 A1   Jan. 28, 2016

Related U.S. Application Data

(62) Division of application No. 14/162,904, filed on Jan. 24, 2014.

(51) Int. Cl.
*H01L 21/311* (2006.01)
*H01L 21/8234* (2006.01)
(Continued)

(52) U.S. Cl.
CPC .. *H01L 21/823437* (2013.01); *H01L 21/31111* (2013.01); *H01L 21/823418* (2013.01);
(Continued)

(58) Field of Classification Search
CPC ................. H01L 21/823431; H01L 27/0886; H01L 29/66795–29/66818; H01L 29/785–29/7856; H01L 2029/7857–2029/7858
See application file for complete search history.

(56) References Cited

U.S. PATENT DOCUMENTS 6,987,289 B2   1/2006   Nowak
7,129,550 B2   10/2006  Fujiwara et al.
(Continued)

OTHER PUBLICATIONS

Yamashita, T. et al., "Sub-25nm FinFET with advanced fin formation and short channel effect engineering" 2011 Symposium on VLSI Technology (VLSIT) (Jun. 14-16, 2011) pp. 14-15.
(Continued)

*Primary Examiner* — Eric Ward
(74) *Attorney, Agent, or Firm* — Scully, Scott, Murphy & Presser, P.C.; Steven J. Meyers

(57) ABSTRACT

A gate structure straddling a plurality of semiconductor material portions is formed. Source regions and drain regions are formed in the plurality of semiconductor material portions, and a gate spacer laterally surrounding the gate structure is formed. Epitaxial active regions are formed from the source and drain regions by a selective epitaxy process. The assembly of the gate structure and the gate spacer is cut into multiple portions employing a cut mask and an etch to form multiple gate assemblies. Each gate assembly includes a gate structure portion and two disjoined gate spacer portions laterally spaced by the gate structure portion. Portions of the epitaxial active regions can be removed from around sidewalls of the gate spacers to prevent electrical shorts among the epitaxial active regions. A dielectric spacer or a dielectric liner may be employed to limit areas in which metal semiconductor alloys are formed.

10 Claims, 14 Drawing Sheets

(51) Int. Cl.
H01L 29/417 (2006.01)
H01L 27/088 (2006.01)
H01L 29/08 (2006.01)
H01L 21/84 (2006.01)
H01L 29/66 (2006.01)

(52) U.S. Cl.
CPC ........ H01L 21/823431 (2013.01); H01L 21/823468 (2013.01); H01L 21/845 (2013.01); H01L 27/088 (2013.01); H01L 29/0847 (2013.01); H01L 29/41783 (2013.01); H01L 29/665 (2013.01); H01L 29/66795 (2013.01)

(56) References Cited

U.S. PATENT DOCUMENTS

| | | | |
|---|---|---|---|
| 7,262,086 B2 | 8/2007 | Yeo et al. | |
| 7,301,206 B2 | 11/2007 | Yeo et al. | |
| 7,315,994 B2 | 1/2008 | Aller et al. | |
| 7,361,958 B2 | 4/2008 | Brask et al. | |
| 7,709,893 B2 | 5/2010 | Bauer et al. | |
| 7,763,531 B2 | 7/2010 | Abadeer et al. | |
| 8,071,448 B2* | 12/2011 | Okuno | H01L 21/82346 257/900 |
| 8,569,125 B2 | 10/2013 | Standaert et al. | |
| 8,697,514 B2* | 4/2014 | Butt | H01L 21/845 438/213 |
| 9,064,932 B1* | 6/2015 | Pham | H01L 21/82343 |
| 2007/0029624 A1 | 2/2007 | Nowak | |
| 2008/0048262 A1* | 2/2008 | Lee | H01L 29/41791 257/347 |
| 2009/0001464 A1 | 1/2009 | Booth, Jr. et al. | |
| 2011/0204419 A1 | 8/2011 | Johnson et al. | |
| 2012/0043610 A1 | 2/2012 | Cheng et al. | |
| 2012/0280250 A1 | 11/2012 | Basker et al. | |
| 2013/0062708 A1* | 3/2013 | Zhong | H01L 29/66545 257/401 |
| 2013/0320399 A1 | 12/2013 | Chang | |
| 2014/0151761 A1* | 6/2014 | Hsieh | H01L 29/66545 257/288 |

OTHER PUBLICATIONS

Basker, V.S. et al., "A 0.063 μm2 FinFET SRAM cell demonstration with conventional lithography using a novel integration scheme with aggressively scaled fin and gate pitch" 2010 Symposium on VLSI Technology (VLSIT) (Jun. 15-17, 2010) pp. 19-20.

Maitra, K. et al., "Aggressively Scaled Strained-Silicon-on-Insulator Undoped-Body High-k/Metal-Gate nFinFETs for High-Performance Logic Applications" IEEE Electron Device Letters, (Jun. 2011) pp. 713-715, vol. 32, No. 6.

Office Action dated Feb. 25, 2016 received in U.S. Appl. No. 14/162,904.

Office Action dated Aug. 24, 2016 received in the parent U.S. Patent Application, namely U.S. Appl. No. 14/162,904.

* cited by examiner

GATE STRUCTURE CUT AFTER FORMATION OF EPITAXIAL ACTIVE REGIONS

BACKGROUND

The present disclosure relates to a semiconductor structure, and particularly to field effect transistors including epitaxial active regions configured to avoid electrical shorts and a method of manufacturing the same.

Typically, formation of epitaxial source regions and epitaxial drain regions on field effect transistors is performed after patterning gate structures and forming gate spacers. The epitaxial source regions and epitaxial drain regions are formed by a selective epitaxial deposition process such that the epitaxial source regions and the epitaxial drain regions grow only from semiconductor surfaces of source regions and drain regions.

Because semiconductor devices are formed in high density with minimal spacing between adjacent devices and between each pair of a source region and a drain region in a same field effect transistor, process variations during the selective epitaxial deposition process can induce undesirable electrical shorts. Specifically, a higher deposition rate of a deposited semiconductor material during the selective epitaxy deposition process can cause epitaxial source regions and epitaxial drain regions to grow by more than a target thickness, and to undesirably merge with another epitaxial source region or another drain region.

SUMMARY

A gate structure straddling a plurality of semiconductor material portions is formed. Source regions and drain regions are formed in the plurality of semiconductor material portions, and a gate spacer laterally surrounding the gate structure is formed. Epitaxial active regions are formed from the source and drain regions by a selective epitaxy process. The assembly of the gate structure and the gate spacer is cut into multiple portions employing a cut mask and an etch to form multiple gate assemblies. Each gate assembly includes a gate structure portion and two disjoined gate spacer portions laterally spaced by the gate structure portion. The cutting of the gate structure can also remove portions of the epitaxial active regions from around sidewalls of the gate spacers so as to prevent electrical shorts among the epitaxial active regions. A dielectric spacer or a dielectric liner may be employed to limit areas in which metal semiconductor alloys are formed.

According to an aspect of the present disclosure, a semiconductor structure includes a semiconductor material portion located on a substrate and extending along a lengthwise direction, and a gate structure overlying a portion of the semiconductor material portion. A pair of gate spacer portions contacts widthwise sidewalls of the gate structure and is laterally spaced from each other by the gate structure along the lengthwise direction. A dielectric liner contacts lengthwise sidewalls of the gate spacer portions and lengthwise sidewalls of the gate structure and laterally surrounds the semiconductor material portion.

According to another aspect of the present disclosure, a method of forming a semiconductor structure is provided. A plurality of semiconductor material portions is formed on a substrate. A contiguous gate structure and a gate spacer that straddle the plurality of semiconductor material portions are formed. A plurality of epitaxial active regions is formed on physically exposed surfaces of the plurality of semiconductor material portions. The contiguous gate structure and the gate spacer are cut into a plurality of assemblies. Each of the plurality of assemblies includes a gate structure and a pair of gate spacer portions that are disjoined from each other.

DETAILED DESCRIPTION

Figure 1:
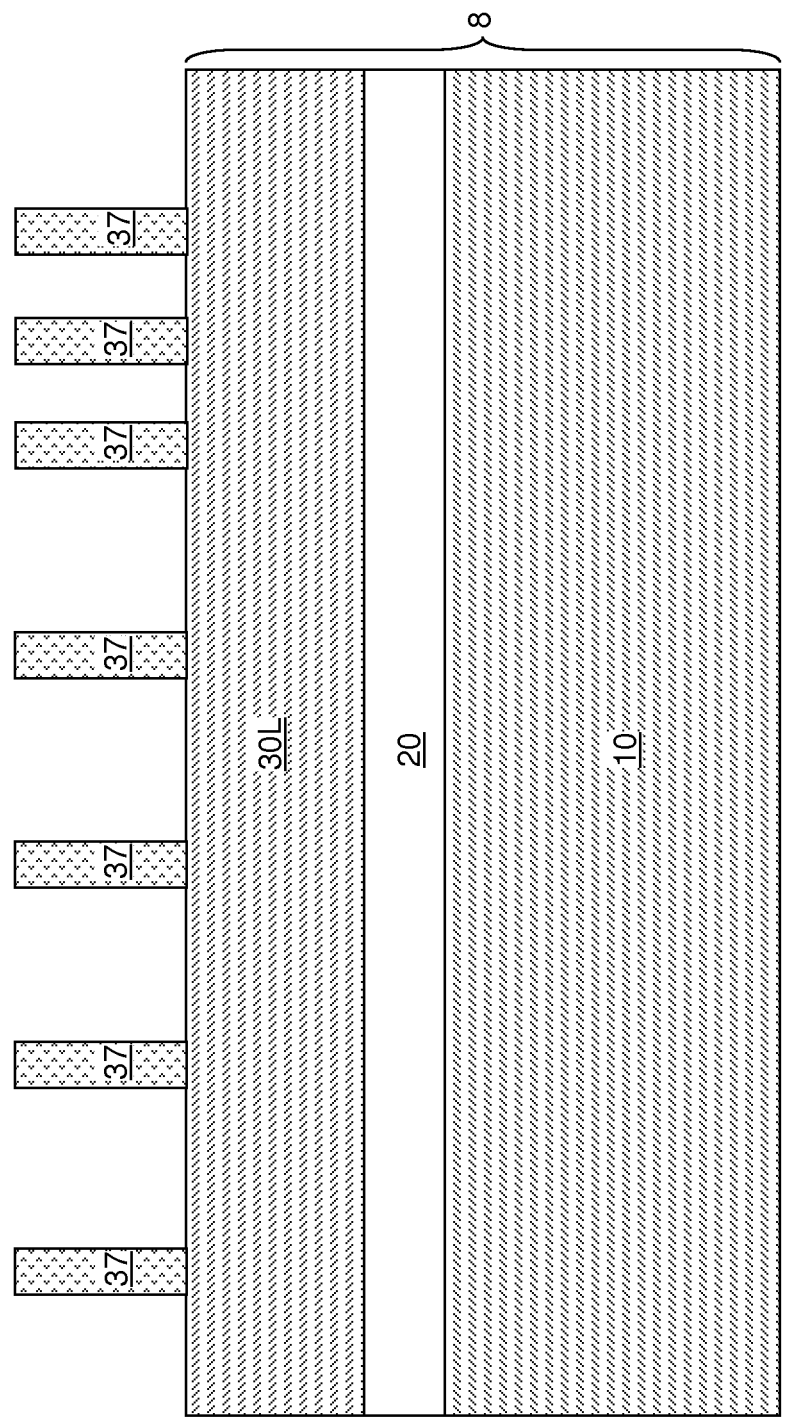
FIG. 1 is a vertical cross-sectional view of an exemplary structure after formation of a patterned photoresist layer over a semiconductor-on-insulator substrate according to an embodiment of the present disclosure.

As stated above, the present disclosure relates to field effect transistors including epitaxial active regions configured to avoid electrical shorts and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Referring to FIG. 1, an exemplary structure according to an embodiment of the present disclosure includes a substrate 8, which includes at least a vertical stack of an insulator layer 20 and a semiconductor material layer 30L. In one embodiment, the substrate 8 can be a semiconductor-on-insulator (SOI) substrate including a handle substrate 10.

The handle substrate 10 can include a semiconductor material, a conductive material, and/or a dielectric material. The handle substrate 10 can provide mechanical support to the insulator layer 20 and the semiconductor material layer 30L. The thickness of the handle substrate 10 can be from 30 microns to 2 mm, although lesser and greater thicknesses can also be employed.

The insulator layer 20 includes a dielectric material. Exemplary dielectric materials that can be employed for the insulator layer 20 include, for example, silicon oxide, silicon nitride, silicon oxynitride, and sapphire. The thickness of the buried insulator layer 20 can be from 50 nm to 5 microns, although lesser and greater thicknesses can also be employed. In one embodiment, the insulator layer 20 and the handle substrate 10 can be a single contiguous structure including a same insulator material, i.e., the handle substrate 10 and the insulator layer 20 can be merged into a single insulating layer including a same insulating material.

The semiconductor material layer 30L includes a semiconductor material. Exemplary semiconductor materials that can be employed for the semiconductor material layer 30L include elemental semiconductor materials (such as silicon or germanium), an alloy of elemental semiconductor materials, a compound semiconductor material, or an organic semiconductor material. In one embodiment, the semiconductor material layer 30L can include a single crystalline semiconductor material. For example, the semiconductor material layer 30L can include single crystalline silicon, a single crystalline silicon-containing semiconductor alloy material, or a single crystalline compound semiconductor material.

While the present invention is described employing an SOI substrate, embodiments are expressly contemplated in which the substrate 8 is a bulk semiconductor substrate.

A patterned photoresist layer 37 is formed over the substrate 8. The patterned photoresist layer 37 can be formed, for example, by applying a photoresist layer over the top surface of the semiconductor material layer 30L, and lithographically patterning the photoresist layer. The shapes of remaining portions of the patterned photoresist layer correspond to horizontal cross-sectional shapes of semiconductor fins to be subsequently formed.

Figure 2:
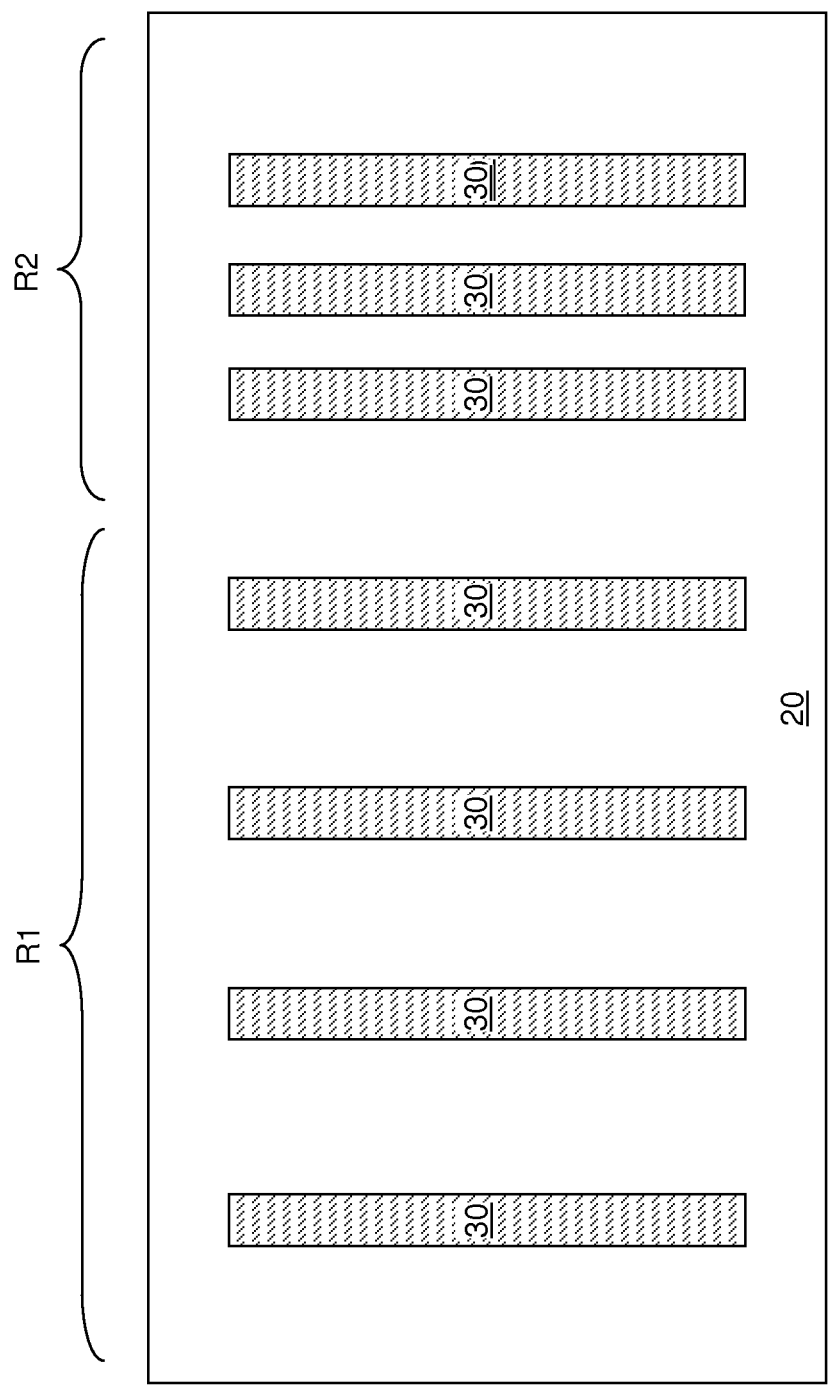
FIG. 2 is a top-down view of the exemplary structure after formation of a plurality of semiconductor fins according to an embodiment of the present disclosure.

Referring to FIG. 2, the pattern in the patterned photoresist layer 37 can be transferred through the semiconductor material layer 30L employing an anisotropic etch. The insulator layer 20 can be employed as an etch stop layer. Remaining portions of the semiconductor material layer 30L constitute a plurality of semiconductor fins 30. The plurality of semiconductor fins 30 is formed on a substrate (10, 20) including the handle substrate 10 and the insulator layer 20. As used herein, a "semiconductor fin" refers to a semiconductor material portion including a parallel pair of vertical sidewalls and a parallel pair of a top surface and a bottom surface.

In one embodiment, the plurality of semiconductor fins 30 can include first semiconductor fins located in a first device region R1 and second semiconductor fins located in a second device region R2. In one embodiment, the first semiconductor fins can be laterally spaced from one another by a greater distance than the second semiconductor fins. If a bulk semiconductor substrate is employed, a shallow trench isolation layer can be formed around lower portions of the semiconductor fins after formation of the plurality of semiconductor fins.

In one embodiment, each of the plurality of semiconductor fins 30 can extend along a lengthwise direction. As used herein, the "lengthwise direction" of an element is the direction around which the moment of inertia of the element is minimized. In one embodiment, each semiconductor fin 30 can be a rectangular parallelepiped, and the lengthwise direction of the semiconductor fin 30 can coincide with the direction of the longest side of the rectangular parallelepiped. The horizontal direction that is perpendicular to a lengthwise direction of a semiconductor fin 30 is herein referred to as a widthwise direction. As used herein, a "lengthwise" element is an element that extends along a corresponding lengthwise direction, and a "widthwise" element is an element that extends along a corresponding widthwise direction. In one embodiment, the plurality of semiconductor fins 30 can be a set of semiconductor fins having the same lengthwise direction. In this case, the set of semiconductor fins is referred to as parallel semiconductor fins.

Figure 3:
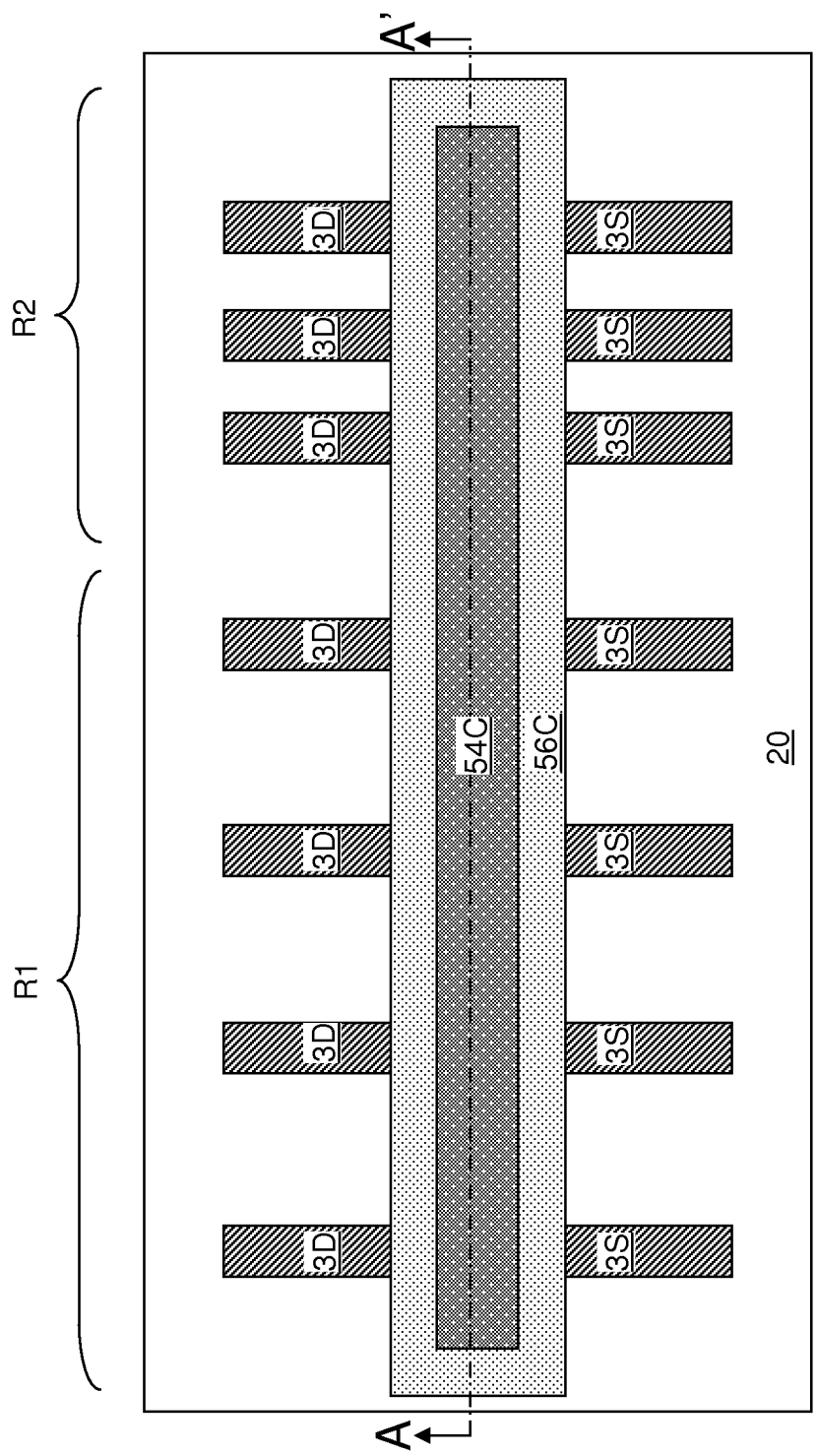
FIG. 3 is a top-down view of the exemplary structure after formation of a gate structure and a gate spacer according to an embodiment of the present disclosure.
Figure 3A:
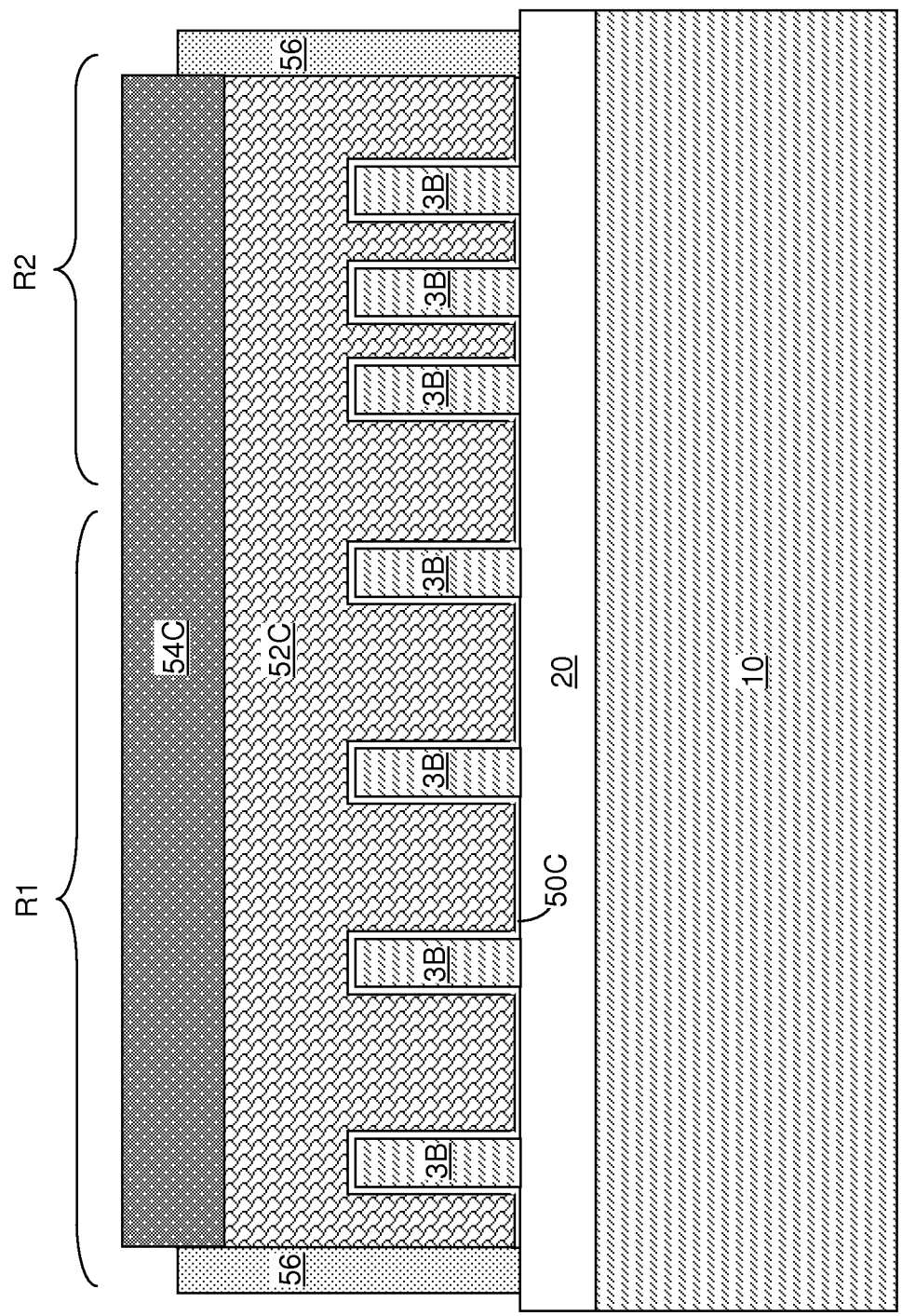
FIG. 3A is a vertical cross-sectional view of the exemplary structure along the vertical plane B-B' of FIG. 3.

Referring to FIGS. 3 and 3A, a gate dielectric layer, at least one conductive material layer, and a gate cap dielectric layer are sequentially deposited over the plurality of semiconductor fins 30 and the insulator layers 20. The gate dielectric layer can include any dielectric material that can be employed as a gate dielectric as known in the art. The at least one conductive material layer can include any gate conductor material known in the art. The gate cap dielectric layer includes a dielectric material such as silicon nitride.

The stack of the gate dielectric layer, the at least one conductive material layer, and the gate cap dielectric layer is patterned by a combination of lithographic methods and an anisotropic etch to form a contiguous gate structure (50C, 52C, 54C), which includes a contiguous gate dielectric 50C, a contiguous gate electrode 52C, and a contiguous gate cap dielectric 54C. The gate dielectric layer and the at least one conductive material layer can be patterned to form various gate structures.

Various portions of the semiconductor fins 30 (See FIG. 2) can be implanted with p-type dopants or n-type dopants to form source regions 3S and drain regions 3D. The source regions 3S and the drain regions 3D are herein collectively referred to as active semiconductor regions (3S, 3D). Unimplanted portions of the semiconductor fins 30 constitute body regions. The ion implantation process at this processing step is optional, i.e., may be omitted. In this case, ion implantation to form source regions 3S and drain regions 3D may be deferred until after formation of gate spacers or until the time of in-situ doped source/drain epitaxy process.

A gate spacer 56C can be formed around the sidewalls of the contiguous gate structure (50C, 52C, 54C). The gate spacer 56 can be formed, for example, by conformal deposition of a dielectric material layer and an anisotropic etch that removes horizontal portions of the dielectric material layer. Sidewall surfaces of the source regions 3S and the drain regions 3D are physically exposed by an overetch of the dielectric material layer during the anisotropic etch. An upper portion of the contiguous gate cap dielectric 54C can be recessed during the overetch step of the anisotropic etch. Optionally, an additional ion implantation can be performed into the source regions 3S and the drain regions 3D after formation of the gate spacer 56C. The contiguous gate structure (50C, 52C, 54C) and the gate spacer 56C straddle the plurality of semiconductor fins.

The gate spacer 56C contacts a proximal portion of each sidewall of the source regions 3S and the drain regions 3D. Further, the gate spacer 56C contacts a proximal portion of each top surface of the source regions 3S and the drain regions 3D. As used herein, a "proximal portion" of a sidewall of a source region 3S or a sidewall of a drain region 3D refers to a portion of the corresponding sidewall that is more proximal to the contiguous gate structure (50C, 52C, 54C) than another portion of the corresponding sidewall. In other words, the contiguous gate structure (50C, 52C, 54C) is the reference structure from which proximity of a portion of any sidewall of a source region 3S or a drain region 3D is measured. The lateral width of any portion of the gate spacer 56C can be the same as the thickness of the conformal dielectric material layer from which the gate spacer 56C is formed, and can be in a range from 5 nm to 100 nm, although lesser and greater thicknesses can also be employed.

Figure 4:
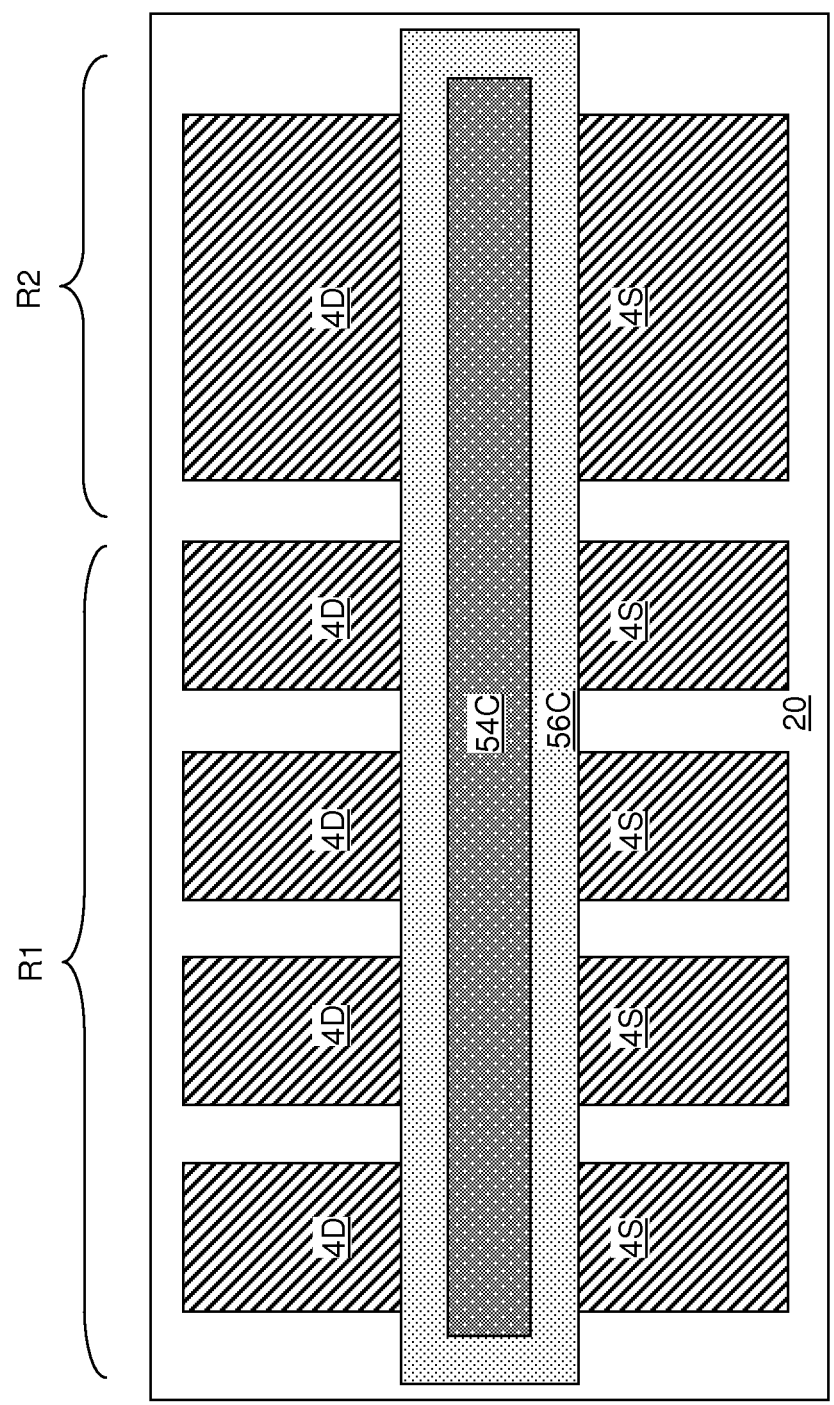
FIG. 4 is a top-down view of the exemplary structure after formation of epitaxial active regions according to an embodiment of the present disclosure.

Referring to FIG. 4, epitaxial source regions 4S and epitaxial drain regions 4D can be formed on the physically exposed semiconductor surfaces of the exemplary structure by selective epitaxy of a semiconductor material. In one embodiment, the source regions 3S and the drain regions 3D can be single crystalline, and the selective epitaxy process can provide growth of a single crystalline semiconductor material from the crystalline surfaces of the source regions 3S and the drain regions 3D, while suppressing growth of the semiconductor material on dielectric surface. The dielectric surfaces include the surfaces of the gate spacer 56C, the contiguous gate cap dielectric 54C, and the insulator layer 20 (or a shallow trench isolation layer if a bulk semiconductor substrate is employed instead of an SOI substrate).

During the selective epitaxy process, one or more deposition processes of a semiconductor material and one or more etch processes of the semiconductor material proceed simultaneously or alternately. The growth rate of the semiconductor material due to the one or more deposition processes on single crystalline surfaces is greater than the deposition rate of the semiconductor material due to the one or more deposition processes on dielectric surfaces. The etch rate of the semiconductor material due to the one or more etch processes is set to be greater than the deposition rate of the semiconductor material due to the one or more deposition processes on the dielectric surfaces, and to be lesser than growth rate of the semiconductor material due to the one or more deposition processes on the semiconductor surfaces. Thus, a net deposition of the semiconductor material occurs only on the semiconductor surfaces such as the surfaces of the source regions 3S and the drain regions 3D, and does not occur on the dielectric surface of the gate spacer 56C, the contiguous gate cap dielectric 54C, and the insulator layer 20 (or a shallow trench isolation layer if a bulk semiconductor substrate is employed instead of an SOI substrate).

The semiconductor material portions formed by the selective epitaxy process form various epitaxial source regions 4S and epitaxial drain regions 4D. The epitaxial source regions 4S and the epitaxial drain regions 4D are collectively referred to as epitaxial active regions (4S, 4D). The epitaxial active regions (4S, 4D) are formed on physically exposed surfaces of the plurality of semiconductor fins.

The duration of the selective epitaxy process is selected so that neighboring semiconductor fins are not electrically shorted to each other. For example, the epitaxial source regions 4S and the epitaxial drain regions 4D in the first device region R1 do not contact any neighboring epitaxial source region 4S or any neighboring drain region 4D. In one embodiment, the lateral distance between a neighboring pair of epitaxial source regions 4S or a neighboring pair of epitaxial drain regions 4D can be a sublithographic dimension, i.e., a dimension less than a critical dimension. A critical dimension refers to a dimension that is less than the minimum dimension that can be printed by a single lithographic exposure. As of 2013, the critical dimension is 32 nm. In one embodiment, the duration of the selective epitaxy process can be selected such that some epitaxial active regions on neighboring source regions 3S or on neighboring drain regions 3D are merged into a single contiguous epitaxial active region in the second device region R2, while the epitaxial active regions (4S, 4D) in the first device region R1 do not merge with any other epitaxial active region (4S, 4D). The epitaxy material can be in-situ doped and/or ex-situ doped.

Figure 5:
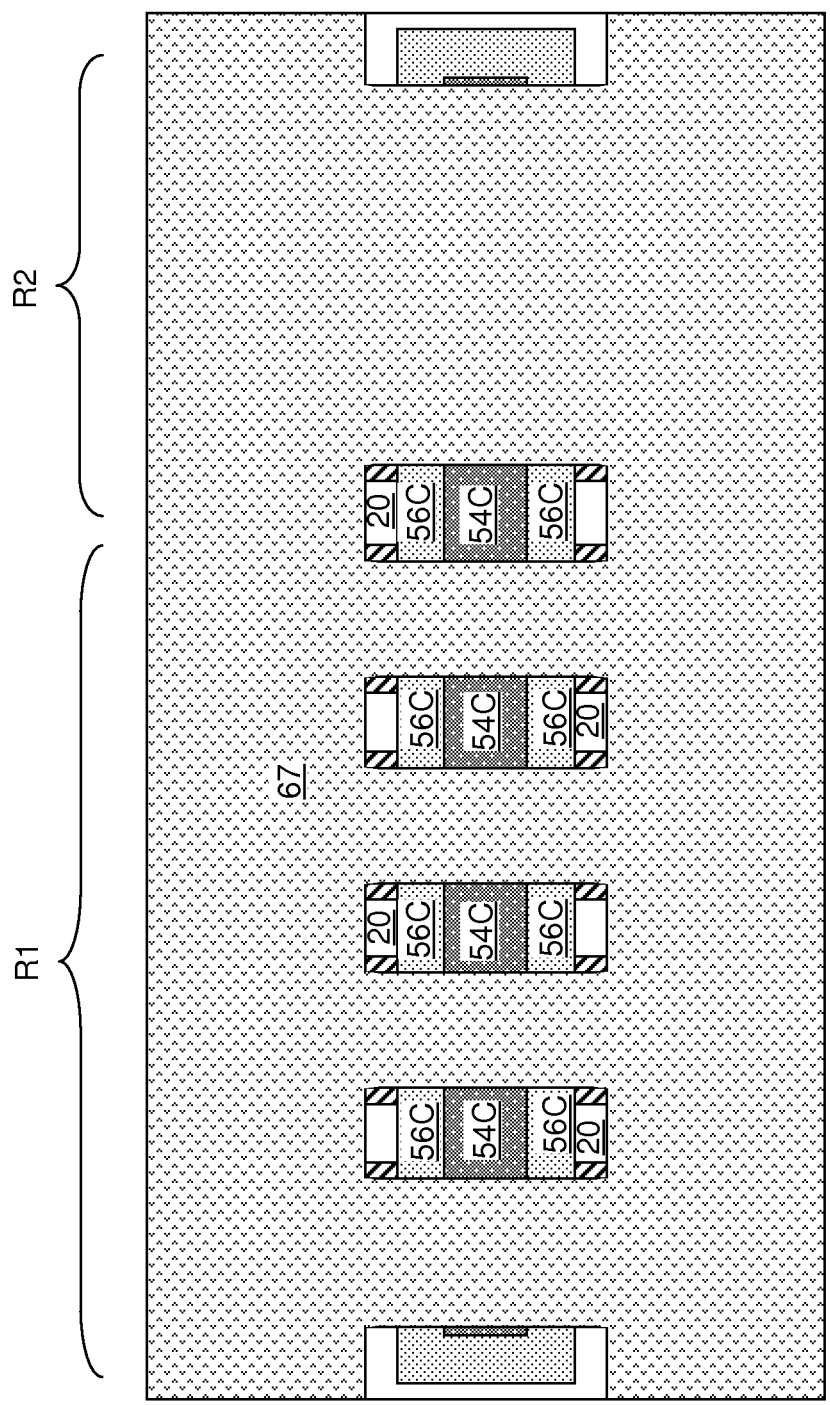
FIG. 5 is a top-down view of the exemplary structure after application and patterning of a mask layer according to an embodiment of the present disclosure.

Referring to FIG. 5, a mask layer 67 is applied over the exemplary semiconductor structure, and is patterned to form openings in regions including interfaces between the epitaxial active regions (4S, 4D) and the gate spacer 56C. In one embodiment, the mask layer 67 can be a photoresist layer. In this case, the photoresist layer can be patterned by lithographic exposure and development. Specifically, the photoresist layer can be applied and patterned over the contiguous gate structure (50C, 52C, 54), the gate spacer 56C, and the plurality of epitaxial active regions (4S, 4D). The locations of openings in the photoresist layer can be selected such that an edge of at least one opening in the photoresist layer overlies the contiguous gate structure (50C, 52C, 54C), the gate spacer 56C, and at least four of the plurality of epitaxial active regions (4S, 4D). The area of the openings can include any area in which a potential electrical short between a neighboring pair of epitaxial active regions (4S, 4D) can be predicted. In one embodiment, the shape of at least one of the openings in the photoresist layer can be a rectangle having two pairs of parallel straight edges.

Figure 6:
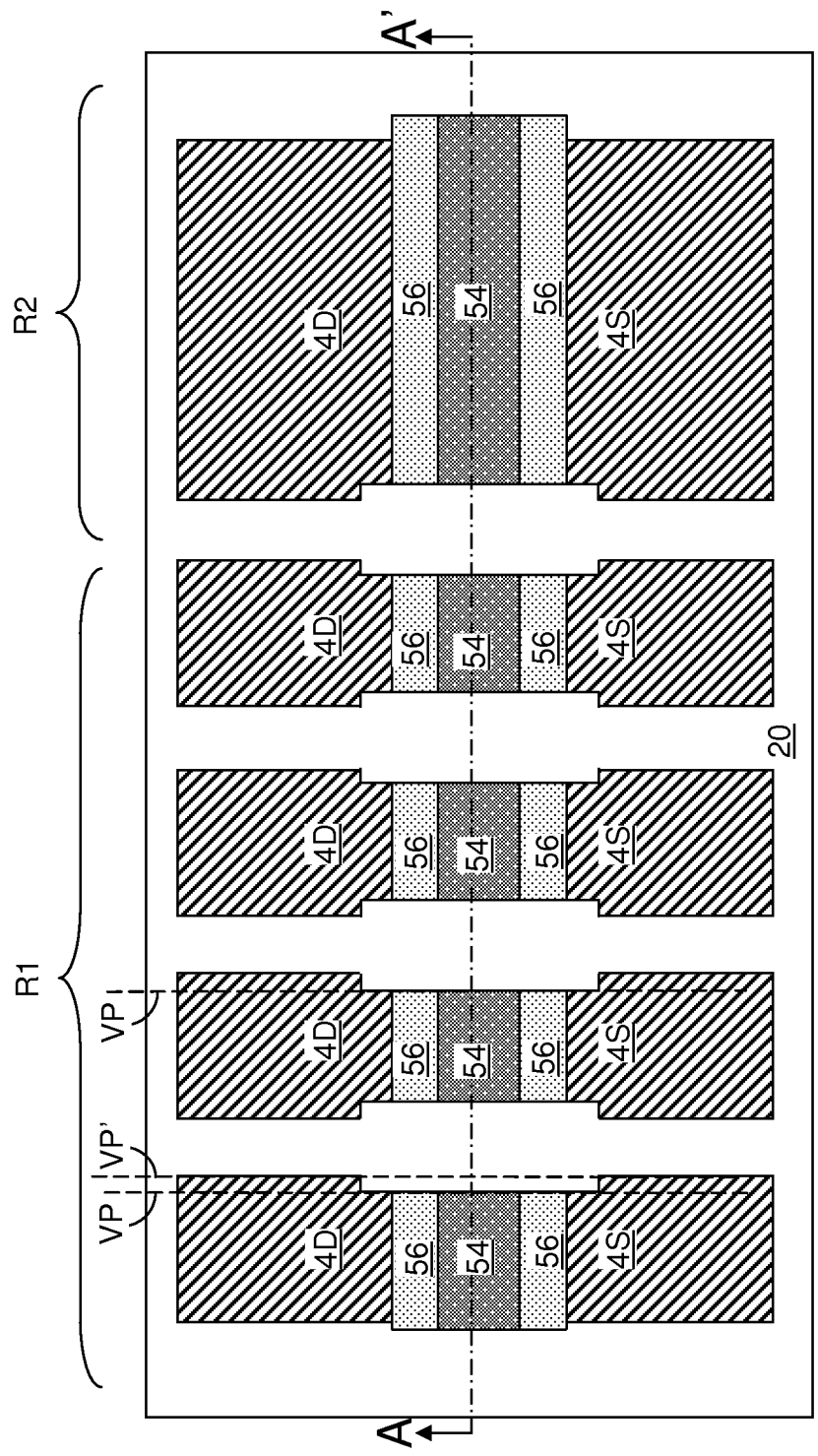
FIG. 6 is a top-down view of the exemplary structure after removal of unmasked portions of the gate structure, the gate spacer and epitaxial active regions according to an embodiment of the present disclosure.
Figure 6A:
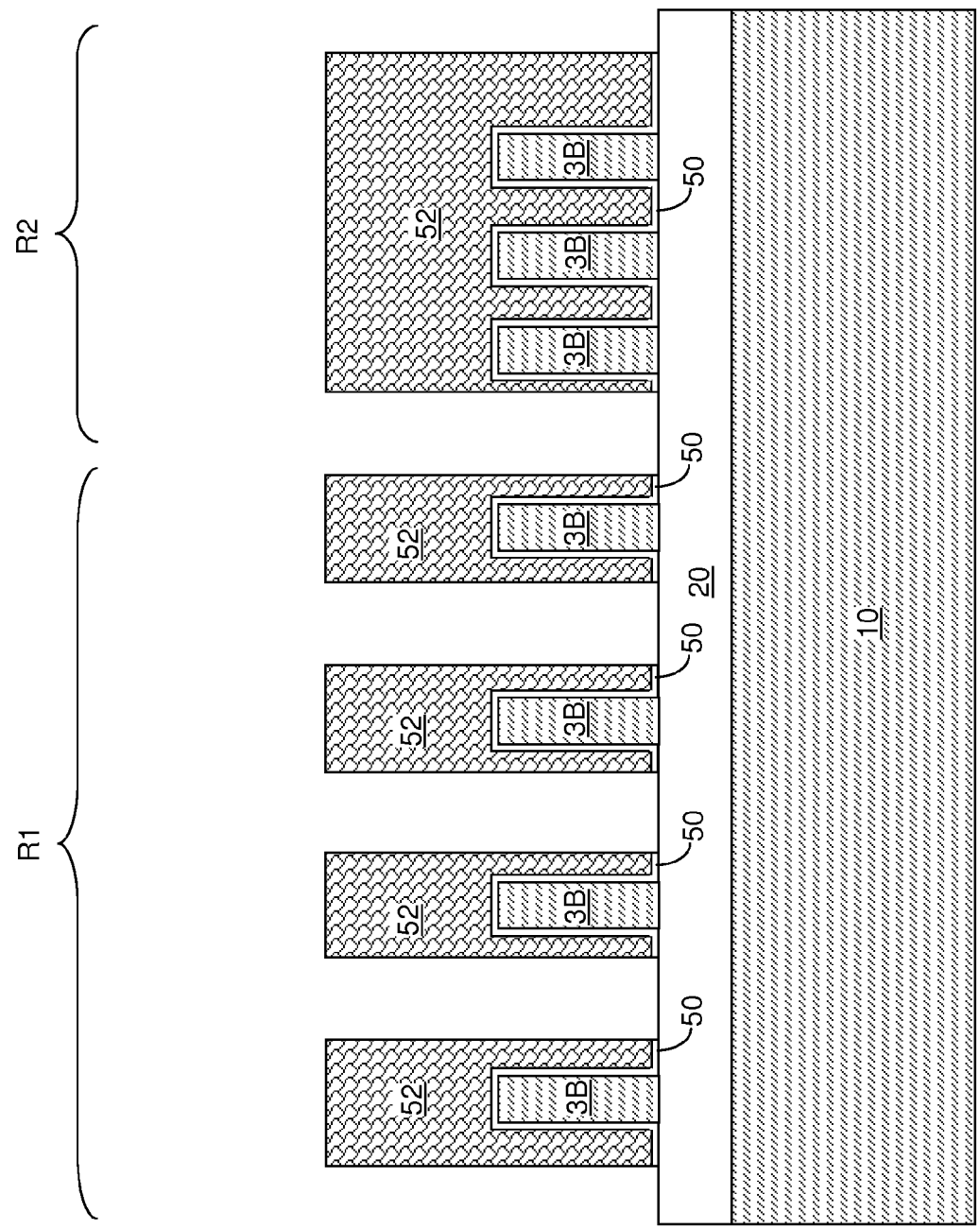
FIG. 6A is a vertical cross-sectional view of the exemplary structure along the vertical plane B-B' of FIG. 6.

Referring to FIGS. 6 and 6A, unmasked portions of the contiguous gate structure (50C, 52C, 54C), the gate spacer 54C, and epitaxial active regions (4S, 4D) can be removed, for example, by an anisotropic etch that employs the mask layer 67 as an etch mask. The contiguous gate structure (50C, 52C, 54C) and the gate spacer 56C are cut into a plurality of assemblies (50, 52, 54, 56). Each of the plurality of assemblies includes a gate structure and a pair of gate spacer portions 56 that are disjoined from each other. As used herein, a first element and a second element are disjoined from each other if none of the surfaces of the first element is in physical contact with any surface of the second element. Each gate structure includes a gate dielectric 50, a gate electrode 52, and a gate cap dielectric 54. Each gate dielectric 50 is a portion of the contiguous gate dielectric 50C, each gate electrode 52 is a portion of the contiguous gate electrode 52C, and each gate cap dielectric 54 is a portion of the contiguous gate cap dielectric 54C. Each gate spacer portion 56 is a remaining portion of the gate spacer 56.

In one embodiment, within a gate structure (50, 52, 54), each of the gate dielectric 50, the gate electrode 52, and the gate cap dielectric 54 has the same horizontal cross-sectional shape. In one embodiment, the same horizontal cross-sectional shape can be a rectangle. In one embodiment, within an assembly (50, 52, 54, 56), the gate structure (50, 52, 54) and the pair of gate spacer portions 56 can extend by a same lateral dimension along a horizontal direction within the widthwise sidewalls of the gate structure (50, 52, 54).

In one embodiment, each of the pair of gate spacer portions 56 within an assembly (50, 52, 54, 56) contacts a top surface and sidewall surfaces of a semiconductor fin (3S, 3D, 3B), which includes a source region 3S, a drain region 3D, and a body region. Specifically, each of the pair of gate spacer portions 56 within an assembly (50, 52, 54, 56)

contacts a top surface and sidewall surfaces of a source region 3S and a top surface and sidewall surfaces of a drain region 3D.

In one embodiment, within an assembly (50, 52, 54, 56), the gate structure (50, 52, 54) and the pair of gate spacer portions 56 can have sidewalls that are located within a same vertical plane VP. In one embodiment, two of the lengthwise sidewalls of the pair of gate spacer portions 56 within an assembly (50, 52, 54, 56) and one of the lengthwise sidewalls of the gate structure (50, 52, 54) within the gate assembly (50, 52, 54, 56) can be within a same vertical plane VP. In one embodiment, each of the pair of gate spacer portions 56 can contact a widthwise sidewall of the gate structure (50, 52, 54), and can be laterally spaced from each other by the lateral dimension of the gate structure (50, 52, 54) along the lengthwise direction, which is the direction along which the moment of inertia of the underlying semiconductor fin (3S, 3D, 3B) is minimized.

In one embodiment, at least one portion of the plurality of epitaxial active regions (4S, 4D) can be removed concurrently with the cutting of the contiguous gate structure (50C, 52C, 54C). In this case, sidewall surfaces of the pair of epitaxial active regions (4S, 4D) located on the same semiconductor fin (3S, 3D, 3B) can be within a vertical plane VP. In one embodiment, a pair of epitaxial active regions (4S, 4D) located on a same semiconductor fin (3S, 3D, 3B) can further includes additional sidewall surfaces located within another vertical plane VP' that is more distal from the center of mass of the semiconductor fin (3S, 3D, 3B) than the vertical plane VP.

Figure 7:
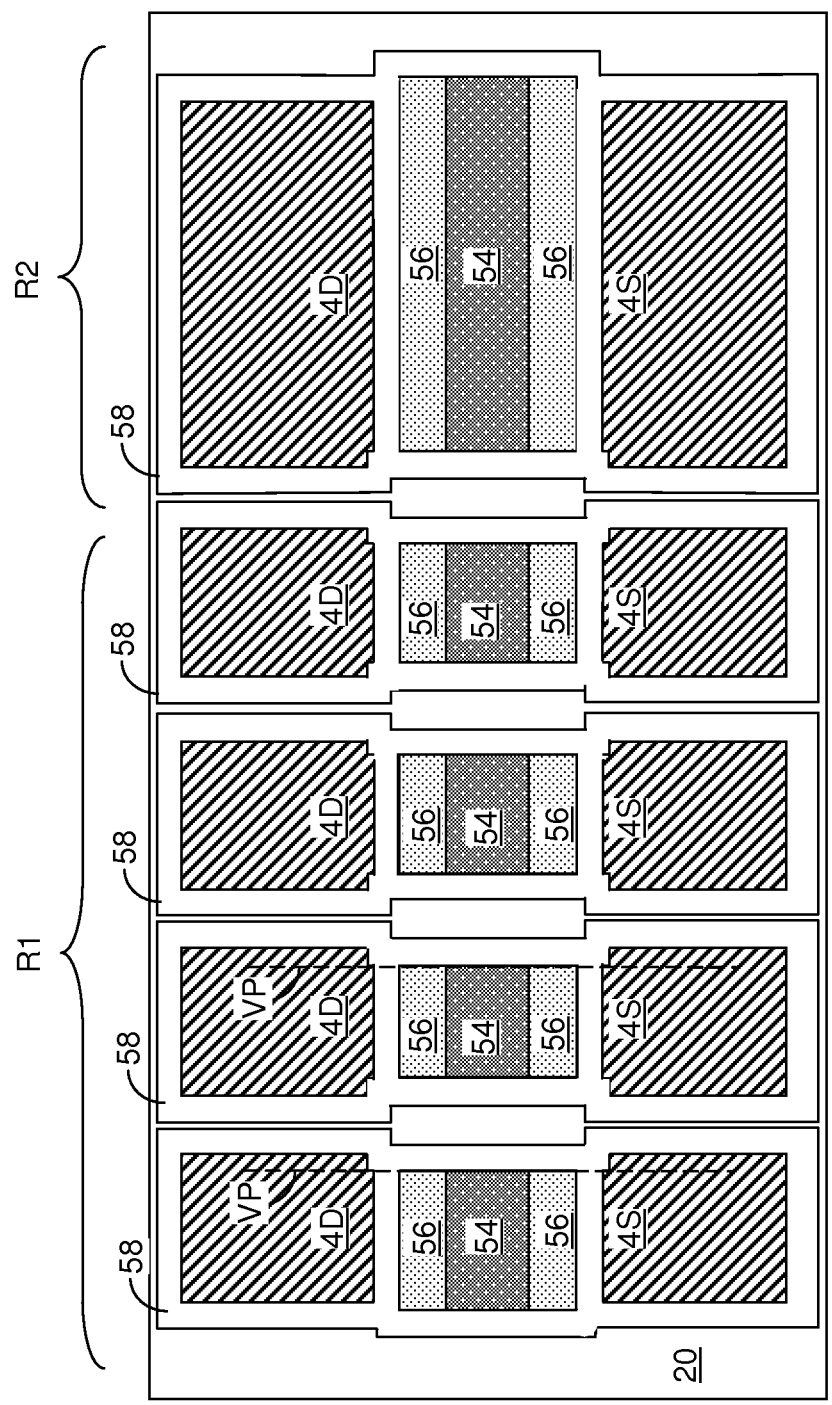
FIG. 7 is a top-down view of the exemplary structure after formation of dielectric liners according to an embodiment of the present disclosure.

Referring to FIG. 7, dielectric liners 58 can be formed around the each combination of an assembly (50, 52, 54, 56), at least one semiconductor fin (3S, 3D, 3B) underlying the assembly (50, 52, 54, 56), and the epitaxial active regions (4S, 4D) formed on the at least one semiconductor fin (3S, 3D, 3B)). Specifically, a plurality of dielectric liners 58 can be formed by deposition of a contiguous dielectric material layer and an anisotropic etch that removes horizontal portions of the contiguous dielectric material layer. Remaining vertical portions of the contiguous dielectric material layer constitutes the dielectric liners 58. Each of the dielectric liners 58 contacts lengthwise sidewalls and widthwise sidewalls of an assembly (50, 52, 54, 56), and laterally surrounds a semiconductor fin (3S, 3D, 3B). Upon formation of the dielectric liners 58, top surfaces of the plurality of epitaxial active regions (4S, 4D) can be physically exposed.

Figure 8:
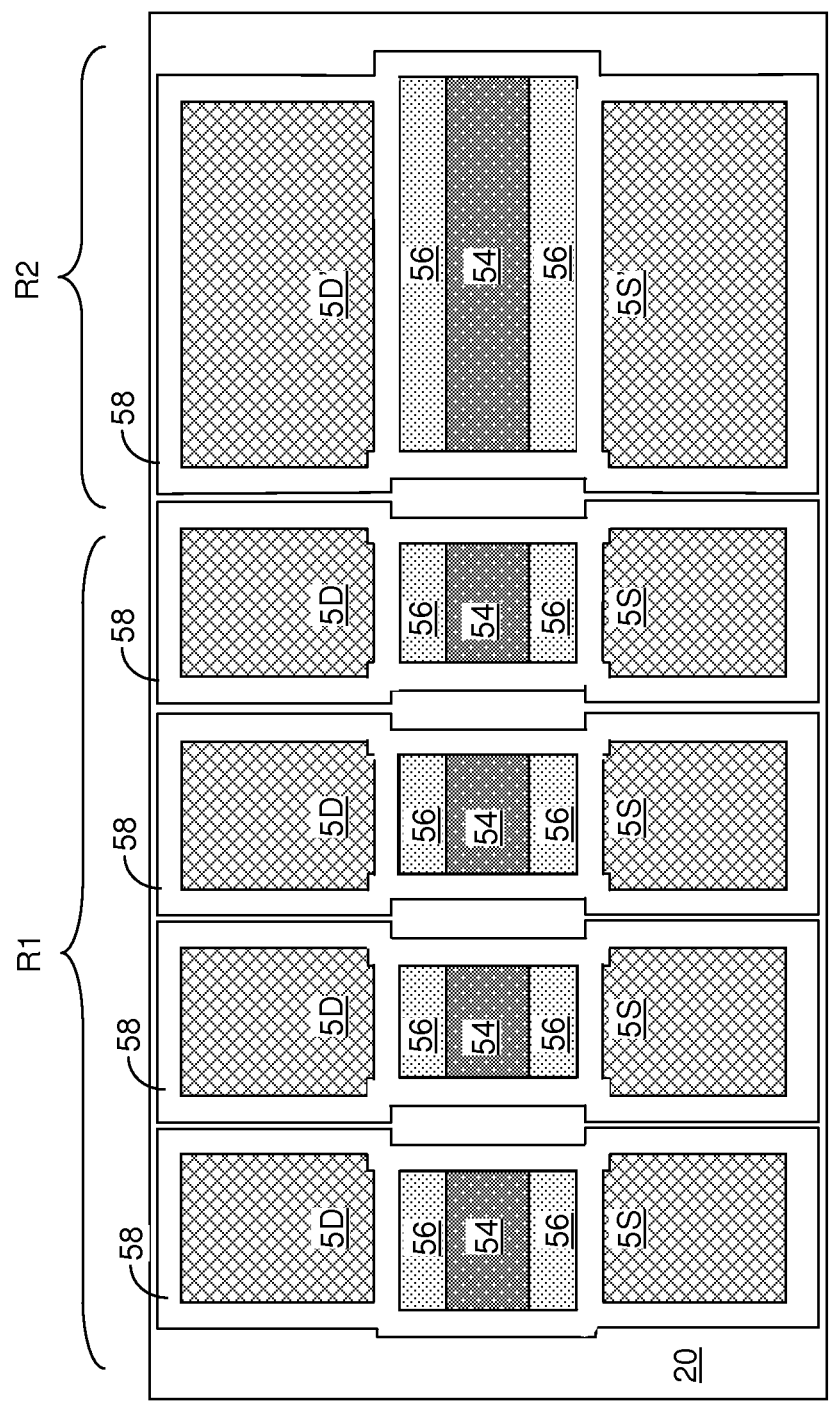
FIG. 8 is a top-down view of the exemplary structure after formation of metal semiconductor alloy regions according to an embodiment of the present disclosure.

Referring to FIG. 8, various metal semiconductor alloy regions (5S, 5D) can be formed on the top surfaces of the epitaxial active regions (4S, 4D). For example, a source-side metal semiconductor alloy region 5S can be formed on each top surface of the epitaxial source region 4S, and a drain-side metal semiconductor alloy region 5D can be formed on each top surface of the epitaxial drain region 4D. In one embodiment, a periphery of each metal semiconductor alloy region (5S, 5D) can be laterally bounded by a periphery of an opening within one of the plurality of dielectric liners 58. In one embodiment, a periphery of each metal semiconductor alloy region (5S, 5D) can coincide with a periphery of an opening within one of the plurality of dielectric liners 58. The metal semiconductor alloy regions (5S, 5D) can be formed, for example, by deposition of a metal layer on the top surfaces of the epitaxial active regions (4S, 4D), reacting the deposited metal with the underlying semiconductor material in the epitaxial active regions (4S, 4D) by an anneal, and removal of unreacted portions of the metal layer by an etch, which can be a wet etch the removes a metal selective to a metal silicide material. The remaining material on the top surfaces of the epitaxial active regions (4S, 4D) constitutes the various metal semiconductor alloy regions (5S, 5D).

Figure 9:
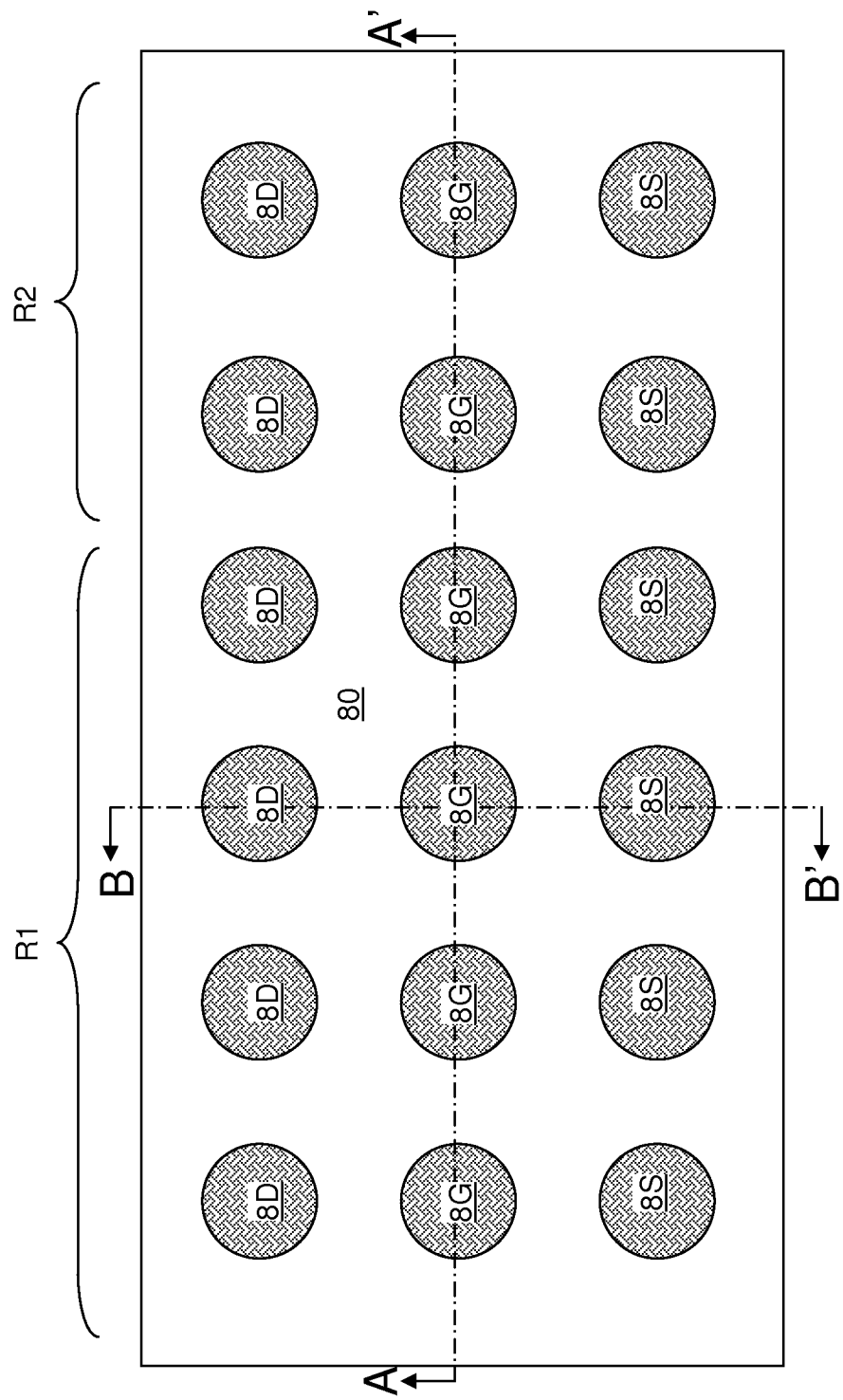
FIG. 9 is a top-down view of the exemplary structure after formation of various contact via structures according to an embodiment of the present disclosure.
Figure 9A:
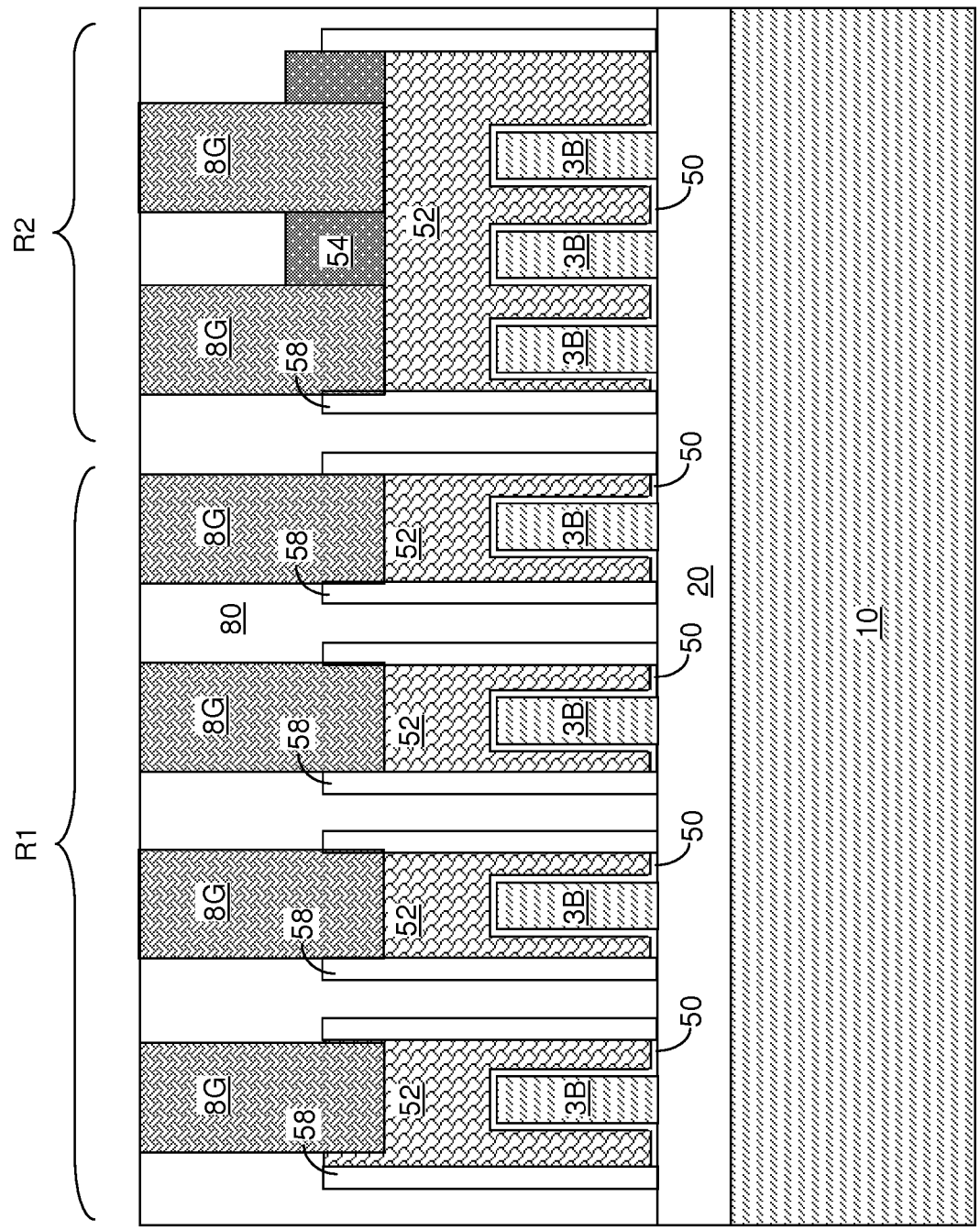
FIG. 9A is a vertical cross-sectional view of the exemplary structure along the vertical plane A-A' of FIG. 9.

Referring to FIGS. 9 and 9A, a contact level dielectric layer 80 is deposited over the gate structures (50, 52, 54). Optionally, the top surface of the contact level dielectric layer 80 can be planarized, for example, by self-planarization as in spin-coating, or by a planarization process such as chemical mechanical planarization (CMP). Various contact via structures (8S, 8D, 8G) can be formed through the contact level dielectric layer 80, for example, by forming via cavities through the contact level dielectric layer 80 and over the epitaxial active regions (5S, 5D) and the gate structures (50, 52, 54), and by filling the via cavities with a conductive material. The various contact via structures (8S, 8D, 8G) can include source-side contact via structures 8S, drain-side contact via structures 8D, and gate-side contact via structures 8G.

The exemplary semiconductor structure includes at least a semiconductor fin (3S, 3D, 3B) located on a substrate (10, 30) and extending along a lengthwise direction, a gate structure (50, 52, 54) overlying a portion of the semiconductor fin (3S, 3D, 3G), a pair of gate spacer portions 56 contacting widthwise sidewalls of the gate structure (50, 52, 54) and laterally spaced from each other by the gate structure (50, 52, 54) along the lengthwise direction, and a dielectric liner 58 contacting lengthwise sidewalls of the gate spacer portions 56 and lengthwise sidewalls of the gate structure (50, 52, 54) and laterally surrounding the semiconductor fin (3S, 3D, 3B).

The dielectric liners 58 do not contact any surface of the plurality of semiconductor fins (3S, 3D, 3B). Each dielectric liner 58 is laterally spaced from a semiconductor fin (3S, 3D, 3B) by a gate spacer portion 56 or one of the epitaxial active regions (4S, 4D). A pair of epitaxial active regions (4S, 4D) can be formed on each semiconductor fin (3S, 3D, 3B). Each epitaxial active region (4S, 4D) on a semiconductor fin (3S, 3D, 3B) contacts inner sidewalls of the dielectric liner 58.

Figure 9B:
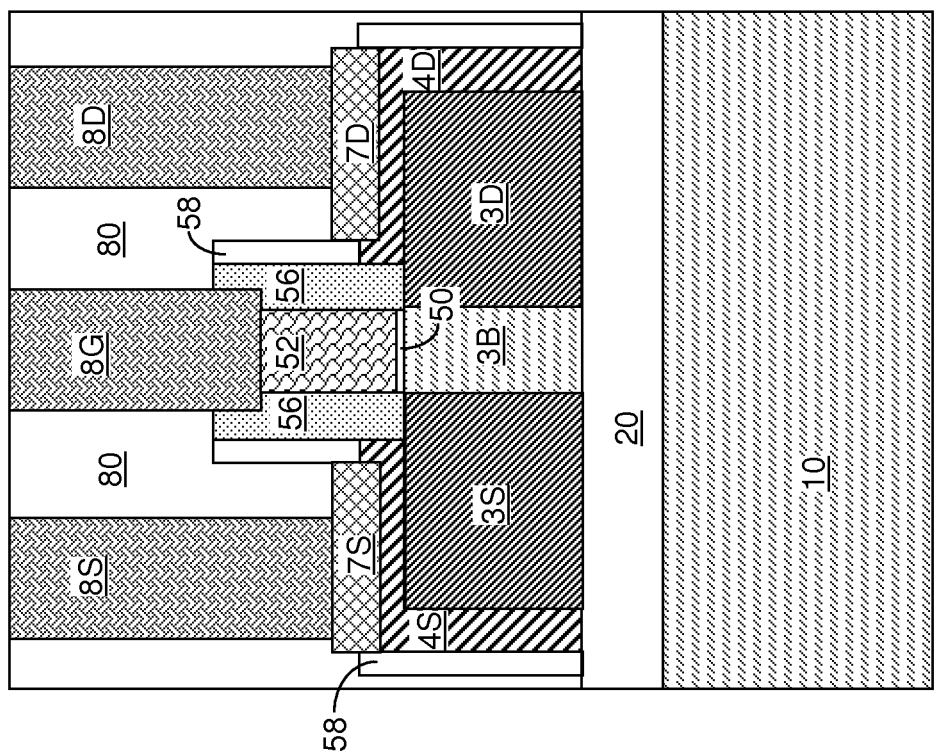
FIG. 9B is a vertical cross-sectional view of the exemplary structure along the vertical plane B-B' of FIG. 9.

In one embodiment, each of a pair of epitaxial active regions (4S, 4D) contacting a semiconductor fin (3S, 3D, 3B) includes a first widthwise sidewall in contact with a lower portion of one of the widthwise sidewalls of the gate spacer portions 56 (as illustrated in FIG. 9B), and a second widthwise sidewall in contact with an inner sidewall of the dielectric liner 58. In one embodiment, the dielectric liner 58 can include at least an opening around the gate structure (50, 52, 54), two openings overlying end portions of the semiconductor fin (3S, 3D, 3B), and an opening around a bottom surface of the semiconductor fin (3S, 3D, 3B).

While the present disclosure is described employing an embodiment in which the materials of the gate structures (50, 52, 54) are not replaced with different gate material to form replacement gate structures, embodiments are also expressly contemplated herein in which replacement gate structures are formed by replacement of the original gate materials in the gate structures (50, 52, 54) with replacement gate structures as known in the art.

Figure 10:
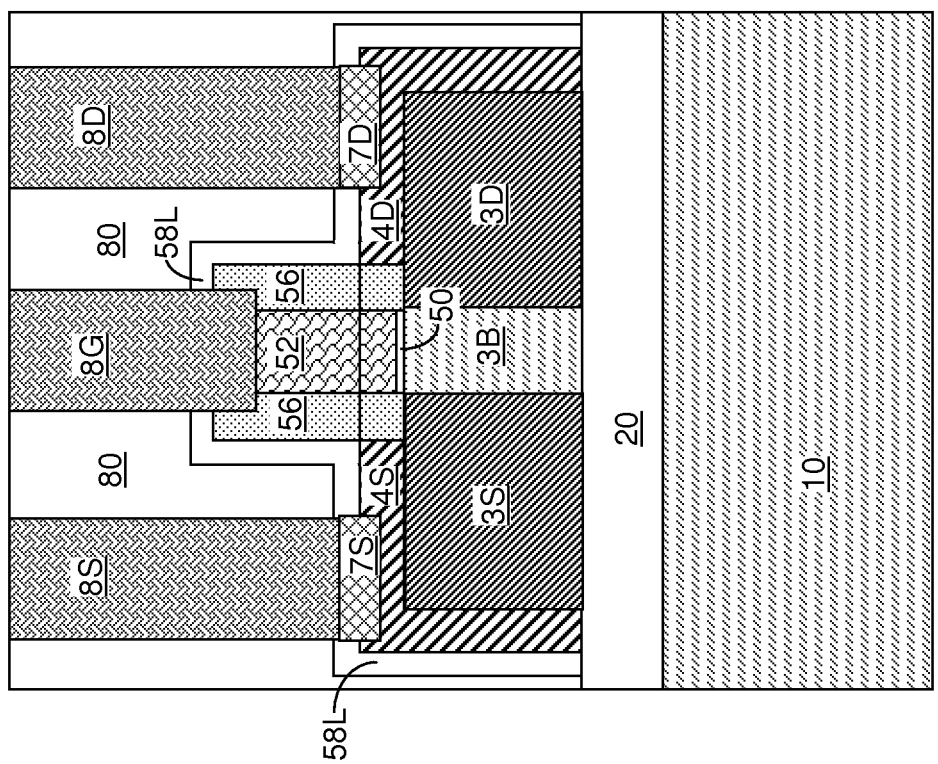
FIG. 10 is a top-down view of a variation of the exemplary structure after formation of various contact via structures according to an embodiment of the present disclosure.

Referring to FIG. 10, a variation of the exemplary structure is illustrated after formation of various contact via structures (8S, 8D, 8G). In this variation, the plurality of dielectric liners 58 in FIG. 7 is replaced with a single dielectric liner 58L that extends throughout the entire top surface of the exemplary structure at the time of formation at a processing step corresponding to the step of FIG. 7. The dielectric liner 58L can be formed by deposition of a contiguous dielectric material layer and by omitting the processing step of performing an anisotropic etch upon contiguous dielectric material layer. Thus, the contiguous dielectric material layer as deposited is the dielectric liner 58. Subsequently, the processing steps of FIGS. 8, 9, and 9A are performed to form the variation of the exemplary structure illustrated in FIG. 10.

The dielectric liner 58 is a contiguous dielectric liner that contacts top surfaces of the plurality of epitaxial active regions (4S, 4D), and does not contact any surface of the plurality of semiconductor fins (3S, 3D, 3B). The dielectric liner 58 is laterally spaced from each of the plurality of semiconductor fins (3S, 3D, 3B) by one of the gate spacer portions 56 and the plurality of epitaxial active regions (4S, 4D).

The various field effect transistors of the present disclosure are formed by performing the cutting of the contiguous gate structure after forming the epitaxial active regions. Unlike prior art methods that perform the step of cutting a contiguous gate structure prior to forming any epitaxial active regions, the cutting of the contiguous gate structure is performed after formation of the epitaxial active regions according to the methods of the present disclosure. The sequence of processing steps of the present disclosure prevents electrical shorts between an epitaxial source region and an epitaxial drain region because of presence of a contiguous gate structure between each pair of an epitaxial source region and an epitaxial drain region at the time of formation of the epitaxial active regions. Further, proximal portions of the epitaxial active regions can be removed, thereby reducing the probability of electrical shorts between an epitaxial source region and an epitaxial drain region even more. In addition, removal of portions of the epitaxial active regions at the time of cutting of the contiguous gate structure can reduce the probability of electrical shorts between each neighboring pair of epitaxial source regions and each neighboring pair of epitaxial drain regions. Thus, the methods of the present disclosure can reduce unwanted electrical shorts among epitaxial active regions relative to known prior art methods.

While the disclosure has been described employing a semiconductor fin as a semiconductor material portion, each semiconductor fin may be replaced with a planar semiconductor material portion within a bulk semiconductor substrate or within a top semiconductor layer within a semiconductor-on-insulator substrate. Particularly, the method of cutting a contiguous gate structure can be performed over any semiconductor structure in which the contiguous gate structure straddles any plurality of semiconductor material portions in which source regions and drain regions can be formed. The same processing steps can be employed with suitable modifications to accommodate the changes in geometry from semiconductor fins to planar semiconductor material portions.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:

forming a plurality of semiconductor material portions on a substrate;

forming a contiguous gate structure and a gate spacer that straddle said plurality of semiconductor material portions;

forming a plurality of epitaxial active regions on physically exposed surfaces of said plurality of semiconductor material portions; and cutting said contiguous gate structure and said gate spacer into a plurality of assemblies, each of said plurality of assemblies including a gate structure and a pair of gate spacer portions that are disjoined from each other, and wherein at least one portion of said plurality of epitaxial active regions is removed concurrently with said cutting of said contiguous gate structure.

2. The method of claim 1, wherein each of said pair of gate spacer portions contacts a widthwise sidewall of said gate structure and is laterally spaced from each other by said gate structure along said lengthwise direction.

3. The method of claim 1, further comprising applying and patterning a photoresist layer over said contiguous gate structure, said gate spacer, and said plurality of epitaxial active regions, wherein an edge of an opening in said photoresist layer overlies said contiguous gate structure, said gate spacer, and at least four of said plurality of epitaxial active regions.

4. The method of claim 3, wherein said gate structure and said pair of gate spacer portions have sidewalls that are located within a same vertical plane.

5. The method of claim 1, further comprising forming at least one dielectric liner, wherein each of said at least one dielectric liner contacts lengthwise sidewalls and widthwise sidewalls of one of said plurality of assemblies, and laterally surrounds one of said plurality of semiconductor material portions.

6. The method of claim 5, wherein said at least one dielectric liner is a plurality of dielectric liners, and is formed by deposition of a contiguous dielectric material layer and an anisotropic etch that removes horizontal portions of said contiguous dielectric material layer, and top surfaces of said plurality of epitaxial active regions are physically exposed upon formation of said plurality of dielectric liners.

7. The method of claim 6, further comprising forming a plurality of metal semiconductor alloy regions on top surfaces of said semiconductor material portions, wherein a periphery one of said plurality of metal semiconductor alloy regions is laterally bounded by a periphery of an opening within one of said plurality of dielectric liners.

8. The method of claim 5, wherein said at least one dielectric liner is a contiguous dielectric liner that contacts top surfaces of said plurality of epitaxial active regions.

9. The method of claim 5, wherein said at least one dielectric is laterally spaced from said plurality of semiconductor material portions by one of said gate spacer portions and said plurality of epitaxial active regions.

10. A method of forming a semiconductor structure comprising:

forming a plurality of semiconductor material portions on a substrate;

forming a contiguous gate structure and a gate spacer that straddle said plurality of semiconductor material portions;

forming a plurality of epitaxial active regions on physically exposed surfaces of said plurality of semiconductor material portions;

applying and patterning a photoresist layer over said contiguous gate structure, said gate spacer, and said plurality of epitaxial active regions, wherein an edge of an opening in said photoresist layer overlies said contiguous gate structure, said gate spacer, and at least four of said plurality of epitaxial active regions; and cutting said contiguous gate structure and said gate spacer into a plurality of assemblies, each of said plurality of assemblies including a gate structure and a pair of gate spacer portions that are disjoined from each other.

\* \* \* \* \*